US011245006B2

(12) United States Patent
Dosev et al.

(10) Patent No.: US 11,245,006 B2
(45) Date of Patent: Feb. 8, 2022

(54) TRENCH SEMICONDUCTOR DEVICE LAYOUT CONFIGURATIONS

(71) Applicants: Polar Semiconductor, LLC, Bloomington, MN (US); SANKEN ELECTRIC CO., LTD., Saitama (JP)

(72) Inventors: Dosi Dosev, Woodbury, MN (US); Don Rankila, Farmington, MN (US); Tatsuya Kamimura, St. Louis Park, MN (US); Shunsuke Fukunaga, Saitama (JP); Steven L. Kosier, Lakeville, MN (US); Peter West, Minneapolis, MN (US)

(73) Assignees: Polar Semiconductor, LLC, Bloomington, MN (US); SANKEN ELECTRIC CO., LTD., Saitama (JP)

( * ) Notice: Subject to any disclaimer, the term of this patent is extended or adjusted under 35 U.S.C. 154(b) by 177 days.

(21) Appl. No.: 16/724,862

(22) Filed: Dec. 23, 2019

(65) Prior Publication Data

US 2020/0127092 A1 Apr. 23, 2020

Related U.S. Application Data

(62) Division of application No. 15/900,571, filed on Feb. 20, 2018, now Pat. No. 10,580,861, which is a
(Continued)

(51) Int. Cl.
*H01L 29/06* (2006.01)
*H01L 29/78* (2006.01)

(52) U.S. Cl.
CPC ...... *H01L 29/0692* (2013.01); *H01L 29/0696* (2013.01); *H01L 29/7811* (2013.01); *H01L 29/0653* (2013.01)

(58) Field of Classification Search
CPC ............. H01L 29/0692; H01L 29/7811; H01L 29/0696; H01L 29/0653
See application file for complete search history.

(56) References Cited

U.S. PATENT DOCUMENTS

| 4,796,070 A | 1/1989 | Black |
| 4,868,631 A * | 9/1989 | Hollingsworth ...... H01L 21/763 257/517 |

(Continued)

FOREIGN PATENT DOCUMENTS

| CN | 102627252 A | * | 8/2012 |
| CN | 104183634 A | * | 12/2014 |
| JP | 2016152335 A | * | 8/2016 |

OTHER PUBLICATIONS

Qian et al., The optimization of deep trench isolation structure for high voltage devices on SOI substrate, Solid-State Electronics, 63, 2011, pp. 154-157 (Year: 2011).*

(Continued)

*Primary Examiner* — Earl N Taylor
(74) *Attorney, Agent, or Firm* — Daly, Crowley, Mofford & Durkee, LLP

(57) ABSTRACT

A trench semiconductor device includes a layer of semiconductor material, an exterior trench pattern formed in the layer of semiconductor material, and an interior trench pattern formed in the layer of semiconductor material, at least partially surrounded by the exterior trench pattern. The exterior trench pattern includes a plurality of exterior trench portions that are each lined with dielectric material and filled with conductive material, and the interior trench pattern includes a plurality of interior trench portions that are each lined with dielectric material and filled with conductive material.

20 Claims, 19 Drawing Sheets

Related U.S. Application Data division of application No. 15/051,642, filed on Feb. 23, 2016, now abandoned.

(60) Provisional application No. 62/119,555, filed on Feb. 23, 2015.

(56) References Cited

U.S. PATENT DOCUMENTS

| | | | |
|---|---|---|---|
| 4,974,059 A | 11/1990 | Kinzer | |
| 5,104,816 A * | 4/1992 | Verret | H01L 29/7325 257/E21.375 |
| 5,597,765 A | 1/1997 | Yilmaz et al. | |
| 5,622,890 A * | 4/1997 | Beasom | H01L 21/768 257/E21.575 |
| 5,977,609 A | 11/1999 | Sodergarg et al. | |
| 5,998,833 A | 12/1999 | Baliga | |
| 6,057,558 A | 5/2000 | Yamamoto et al. | |
| 6,060,747 A | 5/2000 | Okumura et al. | |
| 6,104,054 A * | 8/2000 | Corsi | H01L 21/76264 257/301 |
| 6,392,290 B1 * | 5/2002 | Kasem | H01L 21/6835 257/678 |
| 6,429,481 B1 | 8/2002 | Mo et al. | |
| 6,445,036 B1 * | 9/2002 | Maruoka | H01L 29/0696 257/330 |
| 6,476,443 B1 | 11/2002 | Kinzer | |
| 6,683,363 B2 * | 1/2004 | Challa | H01L 21/763 257/496 |
| 6,822,288 B2 * | 11/2004 | Hshieh | H01L 29/7813 257/330 |
| 6,838,722 B2 * | 1/2005 | Bhalla | H01L 29/4238 257/301 |
| 6,838,735 B1 | 1/2005 | Kinzer et al. | |
| 6,891,223 B2 | 5/2005 | Krumrey et al. | |
| 7,005,351 B2 | 2/2006 | Henninger et al. | |
| 7,250,343 B2 * | 7/2007 | Kotek | H01L 29/407 438/270 |
| 7,348,244 B2 | 3/2008 | Aoki et al. | |
| 7,352,036 B2 * | 4/2008 | Grebs | H01L 29/7809 257/401 |
| 7,535,057 B2 * | 5/2009 | Yang | H01L 29/407 257/335 |
| 7,595,542 B2 * | 9/2009 | Park | H01L 29/7811 257/495 |
| 7,638,841 B2 | 12/2009 | Challa | |
| 7,652,326 B2 | 1/2010 | Kocon | |
| 7,772,673 B1 * | 8/2010 | Yin | H01L 29/0692 257/510 |
| 7,795,137 B2 | 9/2010 | Saito et al. | |
| 7,842,610 B2 * | 11/2010 | Uchiyama | H01L 23/481 438/667 |
| 7,842,969 B2 | 11/2010 | Marreiro et al. | |
| 7,999,312 B2 | 8/2011 | Takaya et al. | |
| 8,084,865 B2 | 12/2011 | Hirler et al. | |
| 8,138,575 B2 | 3/2012 | Stecher | |
| 8,148,749 B2 * | 4/2012 | Grebs | H01L 29/66143 257/172 |
| 8,174,067 B2 | 5/2012 | Yedinak et al. | |
| 8,304,829 B2 | 11/2012 | Yedinak et al. | |
| 8,330,247 B2 | 12/2012 | Marenco | |
| 8,354,730 B2 | 1/2013 | Moriya et al. | |
| 8,674,440 B2 | 3/2014 | Korec et al. | |
| 8,722,502 B2 | 5/2014 | Uchiyama | |
| 8,786,045 B2 * | 7/2014 | Challa | H01L 29/0661 257/490 |
| 8,872,278 B2 * | 10/2014 | Hao | H01L 29/7813 257/401 |
| 8,928,077 B2 | 1/2015 | Lee et al. | |
| 9,048,107 B2 | 6/2015 | Eguchi et al. | |
| 9,087,911 B2 | 7/2015 | Alexandrov et al. | |
| 9,252,251 B2 | 2/2016 | Hirler et al. | |
| 9,252,263 B1 * | 2/2016 | Vielemeyer | H01L 29/7813 |
| 9,356,133 B2 | 5/2016 | Kocon et al. | |
| 9,391,135 B1 | 7/2016 | Grivna et al. | |
| 9,397,213 B2 | 7/2016 | Qin et al. | |
| 9,431,481 B2 | 8/2016 | Lee | |
| 9,673,084 B2 * | 6/2017 | Liu | H01L 27/0922 |
| 9,680,003 B2 * | 6/2017 | Qin | H01L 29/4238 |
| 9,722,075 B2 | 8/2017 | Soeno et al. | |
| 11,031,281 B2 * | 6/2021 | Dong | H01L 21/763 |
| 2002/0071086 A1 | 6/2002 | Kim et al. | |
| 2002/0167071 A1 | 11/2002 | Wang | |
| 2004/0021195 A1 | 2/2004 | Kurosaki et al. | |
| 2004/0070002 A1 * | 4/2004 | Kurosaki | H01L 29/7813 257/127 |
| 2005/0006700 A1 | 1/2005 | Cao | |
| 2005/0032287 A1 | 1/2005 | Nakazawa et al. | |
| 2005/0151190 A1 * | 7/2005 | Kotek | H01L 29/7811 257/341 |
| 2005/0161735 A1 * | 7/2005 | Aoki | H01L 29/045 257/330 |
| 2005/0167742 A1 | 8/2005 | Challa et al. | |
| 2005/0224848 A1 * | 10/2005 | Kurosaki | H01L 29/0696 257/288 |
| 2006/0044487 A1 | 3/2006 | Okada et al. | |
| 2006/0193977 A1 | 8/2006 | Nagura | |
| 2006/0194410 A1 * | 8/2006 | Sugaya | H01L 27/1203 438/424 |
| 2006/0214221 A1 * | 9/2006 | Challa | H01L 29/66734 257/328 |
| 2006/0226475 A1 * | 10/2006 | Yamamoto | H01L 29/4238 257/330 |
| 2006/0267044 A1 | 11/2006 | Yang | |
| 2007/0001230 A1 * | 1/2007 | Lee | H01L 29/0634 257/367 |
| 2007/0029597 A1 * | 2/2007 | Lee | H01L 29/7802 257/302 |
| 2008/0135931 A1 * | 6/2008 | Challa | H01L 21/31116 257/331 |
| 2008/0142883 A1 * | 6/2008 | Grebs | H01L 29/0653 257/334 |
| 2008/0265276 A1 * | 10/2008 | Noda | H01L 29/7397 257/139 |
| 2009/0008709 A1 * | 1/2009 | Yedinak | H01L 29/0634 257/331 |
| 2009/0230561 A1 | 9/2009 | Zundel | |
| 2010/0155879 A1 | 6/2010 | Schulze et al. | |
| 2010/0207205 A1 * | 8/2010 | Grebs | H01L 29/8725 257/334 |
| 2010/0224932 A1 * | 9/2010 | Takaya | H01L 29/7811 257/330 |
| 2010/0230745 A1 * | 9/2010 | Saito | H01L 29/7395 257/329 |
| 2012/0153386 A1 * | 6/2012 | Hirler | H01L 29/872 257/334 |
| 2013/0037906 A1 * | 2/2013 | Hirler | H01L 29/0692 257/506 |
| 2013/0181252 A1 * | 7/2013 | Eguchi | H01L 29/861 257/109 |
| 2013/0193502 A1 * | 8/2013 | Kocon | H01L 29/42376 257/302 |
| 2013/0307060 A1 * | 11/2013 | Wang | H01L 29/063 257/330 |
| 2014/0034999 A1 | 2/2014 | Korec | |
| 2014/0035032 A1 | 2/2014 | Korec et al. | |
| 2014/0035047 A1 | 2/2014 | Korec et al. | |
| 2014/0035102 A1 | 2/2014 | Korec et al. | |
| 2014/0167213 A1 * | 6/2014 | Ficke | H01L 21/762 257/510 |
| 2014/0284701 A1 | 9/2014 | Korec | |
| 2014/0361349 A1 | 12/2014 | Alexandrov et al. | |
| 2015/0115286 A1 * | 4/2015 | Takeuchi | H01L 21/8213 257/77 |
| 2015/0340357 A1 * | 11/2015 | Edwards | H01L 21/76237 257/362 |
| 2016/0013267 A1 | 1/2016 | Lee et al. | |
| 2016/0133742 A1 * | 5/2016 | Okuda | H01L 29/41766 257/330 |
| 2016/0163583 A1 * | 6/2016 | Liu | H01L 29/0692 257/401 |

(56) References Cited

U.S. PATENT DOCUMENTS

| | | | |
|---|---|---|---|
| 2016/0163685 A1* | 6/2016 | Jain | H01L 29/1004 |
| | | | 716/119 |
| 2016/0240653 A1 | 8/2016 | Kocon et al. | |
| 2016/0240667 A1 | 8/2016 | Kocon et al. | |
| 2016/0247879 A1* | 8/2016 | Dosev | H01L 29/0692 |
| 2016/0343802 A1 | 11/2016 | Korec et al. | |
| 2018/0175146 A1* | 6/2018 | Dosev | H01L 29/0696 |

OTHER PUBLICATIONS

U.S. Non-Final Office Action dated Apr. 6, 2018 for U.S. Appl. No. 15/900,571; 18 Pages.

Response to U.S. Non-Final Office Action dated Apr. 6, 2018 for U.S. Appl. No. 15/900,571; Response filed on Jul. 6, 2018; 9 Pages.

U.S. Final Office Action dated Nov. 9, 2018 for U.S. Appl. No. 15/900,571; 13 Pages.

Response to U.S. Final Office Action dated Nov. 9, 2018 for U.S. Appl. No. 15/900,571; Response filed on Jan. 9, 2019; 8 Pages.

U.S. Non-Final Office Action dated Apr. 3, 2019 for U.S. Appl. No. 15/900,571; 13 Pages.

Response to U.S. Non-Final Office Action dated Apr. 3, 2019 for U.S. Appl. No. 15/900,571; Response filed on Jul. 3, 2019; 10 Pages.

U.S. Notice of Allowance dated Oct. 23, 2019 for U.S. Appl. No. 15/900,571; 8 Pages.

Rule 312 Amendment filed on Dec. 27, 2019 for U.S. Appl. No. 15/900,571; 5 Pages.

\* cited by examiner

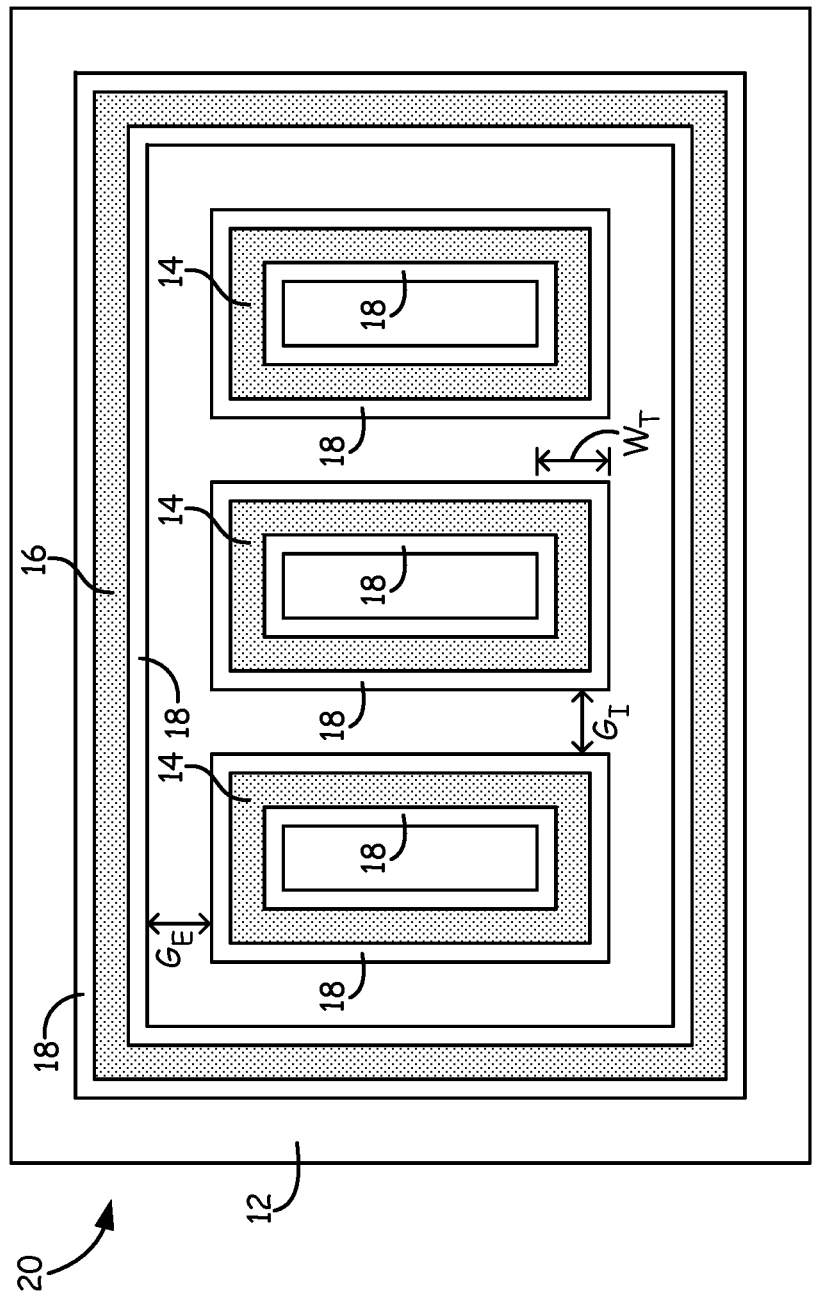

TRENCH SEMICONDUCTOR DEVICE LAYOUT CONFIGURATIONS

CROSS-REFERENCE TO RELATED APPLICATION(S)

This application is a divisional of U.S. application Ser. No. 15/900,571, filed Feb. 20, 2018 for "Trench Semiconductor Device Layout Configurations" by D. Dosev et al., which is a divisional of U.S. application Ser. No. 15/051,642, filed Feb. 23, 2016 for "Trench Semiconductor Device Layout Configurations" by D. Dosev et al., which claims the benefit of U.S. Provisional Application No. 62/119,555 filed Feb. 23, 2015 for "Trench Semiconductor Device Layout Configurations" by D. Dosev et al.

INCORPORATION BY REFERENCE

U.S. application Ser. No. 15/900,571, U.S. application Ser. No. 15/051,642 and U.S. Provisional Application No. 62/119,555 are hereby incorporated herein by reference in their entireties.

BACKGROUND

The present invention relates to geometric layouts of trench semiconductor devices.

In many semiconductor devices, such as modern power MOSFET devices, it is desirable for the device to provide a high breakdown voltage that prevents reverse biasing and avalanche breakdown of the diode barriers of the device. In these devices, application of a reverse bias voltage across a diode barrier creates a depletion region in which the voltage gradient present there causes acceleration of charge carriers and the formation of electron-hole pairs by collisions between the charge carriers and dopant atoms. The electron-hole pairs generally migrate to opposite sides of the depletion region; however, higher levels of reverse bias voltage create higher electric fields in the depletion region, which accelerate the electron-hole pairs to a degree that results in further collisions that form further electron-hole pairs. This multiplication of charge carriers can eventually result in conduction of current in the reverse direction across the diode barrier, which is the condition known as avalanche breakdown of the device.

One technique that has been successfully employed to increase the breakdown voltage of a MOSFET device is to form the device as a trench semiconductor device. A trench semiconductor device consists of a plurality of parallel, interior MOS trenches formed in a semiconductor layer, with each trench being lined with dielectric material and then filled with a conductive material such as metal or doped polysilicon. In addition, an exterior trench is formed around an outside region of the device, having at least a portion generally perpendicular to the interior trenches. The gaps between the trenches effectively terminate the electric fields that tend to converge at the edges of the conductive legs formed in each trench, which results in a higher breakdown voltage. U.S. Pat. No. 6,683,363 illustrates an example of a trench semiconductor device.

Further developments in the geometry of a trench semiconductor device can provide characteristics and results that advance the state of the art, such as in terms of performance, cost, space efficiency, or others, or to simply provide an alternative configuration that may be appropriate for selected applications.

SUMMARY

A trench semiconductor device includes a layer of semiconductor material, an exterior trench pattern formed in the layer of semiconductor material, and an interior trench pattern formed in the layer of semiconductor material, at least partially surrounded by the exterior trench pattern. The exterior trench pattern includes a plurality of exterior trench portions that are each lined with dielectric material and filled with conductive material, and the interior trench pattern including a plurality of interior trench portions that are each lined with dielectric material and filled with conductive material. Various embodiments of the trench semiconductor device with unique trench patterns are disclosed. The various trench patterns provide configurations and/or performance characteristics that may be suitable for particular applications of the devices.

BRIEF DESCRIPTION OF THE DRAWINGS

FIGS. 2-16 are top plan views of MOSFET devices formed as trench semiconductor devices according to various embodiments of the present invention.

DETAILED DESCRIPTION

Figure 1A:
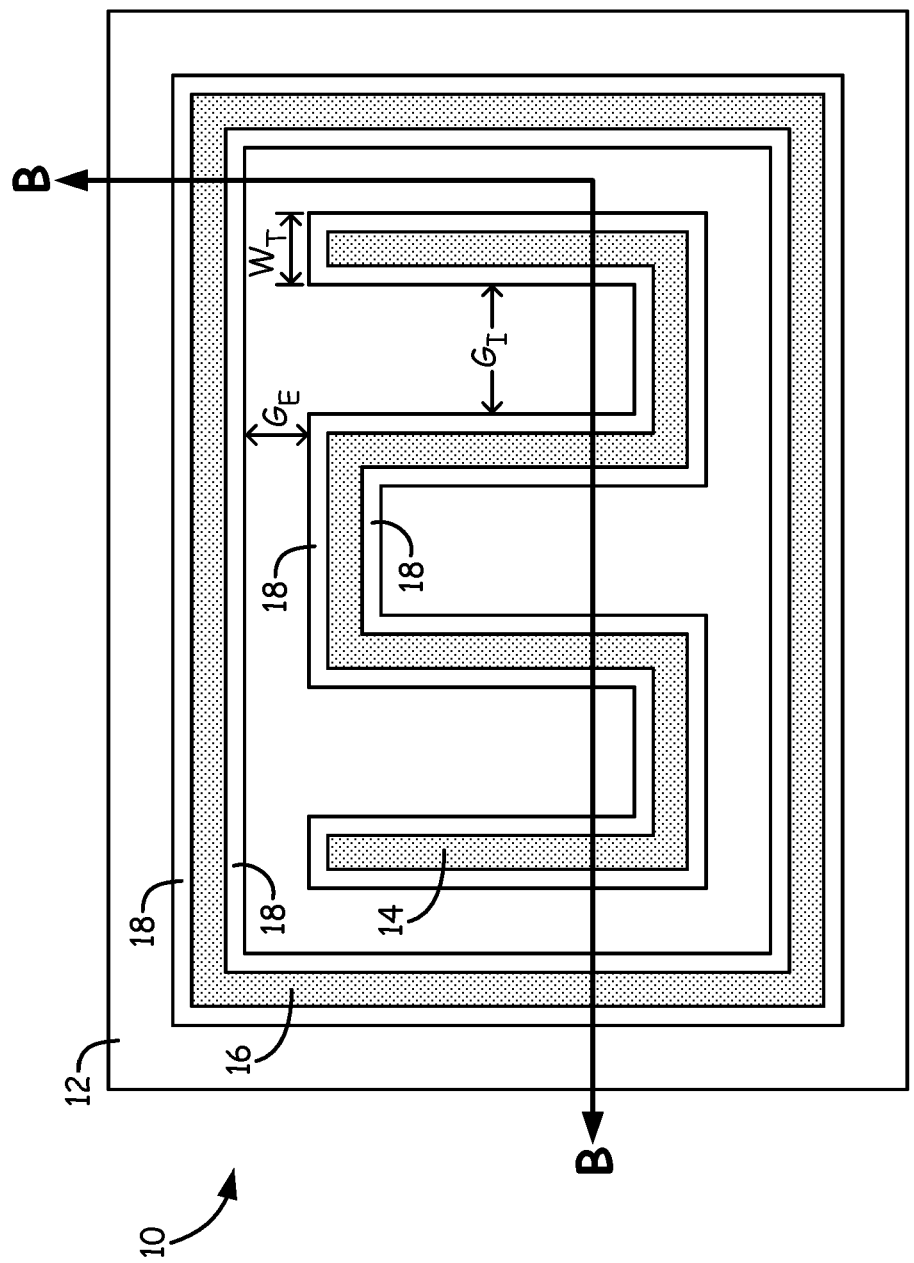
FIG. 1A is a top plan view of a MOSFET device formed as a trench semiconductor device according to an embodiment of the present invention.
Figure 1B:
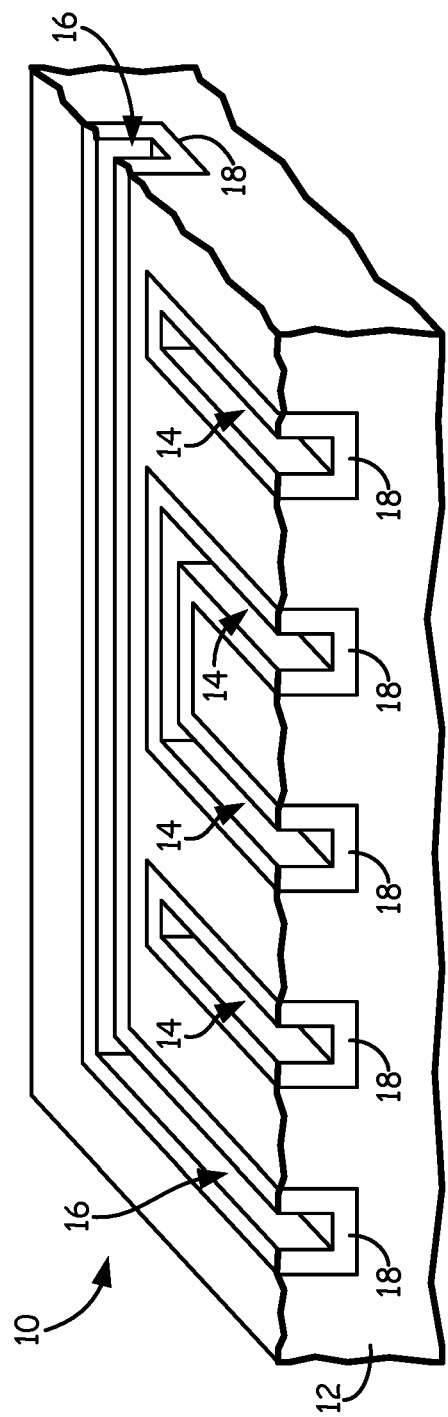
FIG. 1B is a perspective view of the MOSFET device shown in FIG. 1A, sectioned at line B-B in FIG. 1A.

FIG. 1A is a top plan view of MOSFET device 10 formed as a trench semiconductor device according to an embodiment of the present invention. FIG. 1B is a perspective view of MOSFET device 10 sectioned at line B-B in FIG. 1A. As shown in FIGS. 1A and 1B, MOSFET device 10 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. A metal layer (not shown) is formed over the entire structure, so that a metal/semiconductor barrier is formed where the metal layer adjoins the mesa regions of semiconductor layer 12 between interior trenches 14.

As best illustrated in FIG. 1A, interior trenches 14 are formed in a snake pattern enclosed by exterior trench 16. In the snake pattern, the legs of interior trenches 14 are separated from one another by interior gap distance $G_I$. Each leg of interior trenches 14 has a trench width $W_T$, and interior trenches 14 are spaced from exterior trench 16 by gap distance $G_E$.

In an exemplary embodiment, gap distance $G_I$ may be about 2 micrometers (μm), trench width $W_T$ may be about 1.4 μm, and gap distance $G_E$ may be about 2 μm.

FIGS. 2-16 are top plan views of MOSFET devices formed as trench semiconductor devices with alternative trench patterns. Only top plan views of these embodiments are shown, for simplicity, as the nature of the perspective view of each embodiment (similar to that shown in FIG. 1B) will be apparent to those skilled in the art based on the configuration illustrated in the corresponding top plan view. A fill pattern is used in FIGS. 2-16 to illustrate the trench patterns, for ease of understanding.

FIG. 2 is a top plan view of MOSFET device 20 formed as a trench semiconductor device according to another embodiment of the present invention. MOSFET device 20 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern of closed rectangles, enclosed by exterior trench 16. In the pattern shown, the sides of each closed rectangle formed by interior trenches 14 are separated from one another by interior gap distance $G_I$. Each interior trench 14 has a trench width $W_T$, and interior trenches 14 are spaced from exterior trench 16 by gap distance $G_E$.

In an exemplary embodiment, gap distance $G_I$ may be about 2 μm, trench width $W_T$ may be about 1.4 μm, and gap distance $G_E$ may be about 2 μm.

Figure 3:
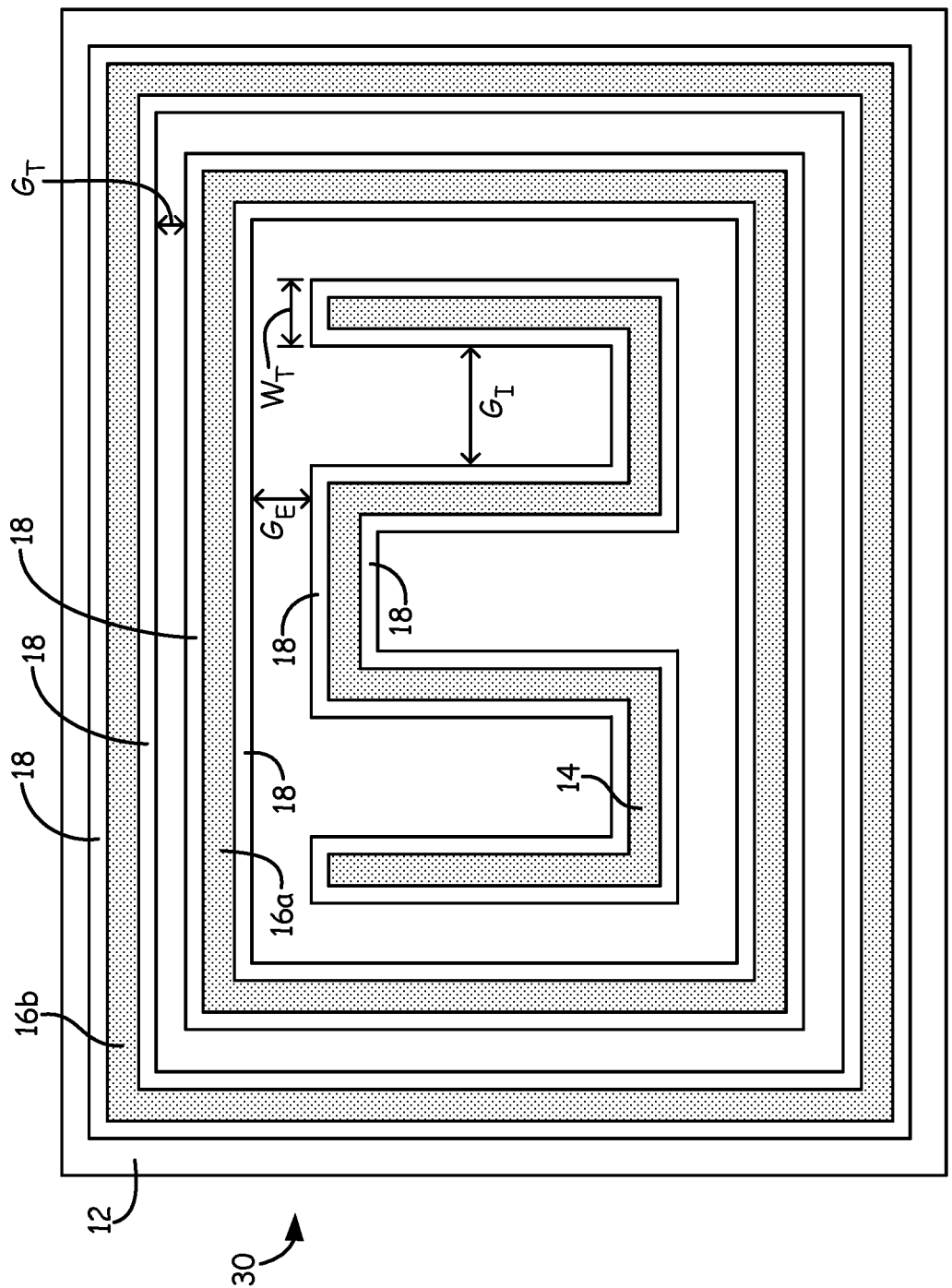

FIG. 3 is a top plan view of MOSFET device 30 formed as a trench semiconductor device according to another embodiment of the present invention. MOSFET device 30 includes semiconductor layer 12, a plurality of interior trenches 14 formed in semiconductor layer 12, intermediate trench 16a formed in semiconductor layer 12, and exterior trench 16b formed in semiconductor layer 12. Interior trenches 14, intermediate trench 16a and exterior trench 16b are lined with dielectric material 18, such as silicon dioxide in some embodiments, and the dielectric lined trenches are filled with a conductive material (not shown) such as a metal or doped polysilicon. Interior trenches 14 are formed in a snake pattern enclosed by intermediate trench 16a, and intermediate trench 16a is enclosed by exterior trench 16b. In the snake pattern, the legs of interior trenches 14 are separated from one another by interior gap distance $G_I$. Each leg of interior trenches 14 has a trench width $W_T$, and interior trenches 14 are spaced from intermediate trench 16a by gap distance $G_E$. Intermediate trench 16a is separated from exterior trench 16b by gap distance $G_T$.

In an exemplary embodiment, gap distance $G_I$ may be about 2 μm, trench width $W_T$ may be about 1.4 μm, gap distance $G_E$ may be about 2 μm, and gap distance $G_T$ may be about 2 μm.

Figure 4:
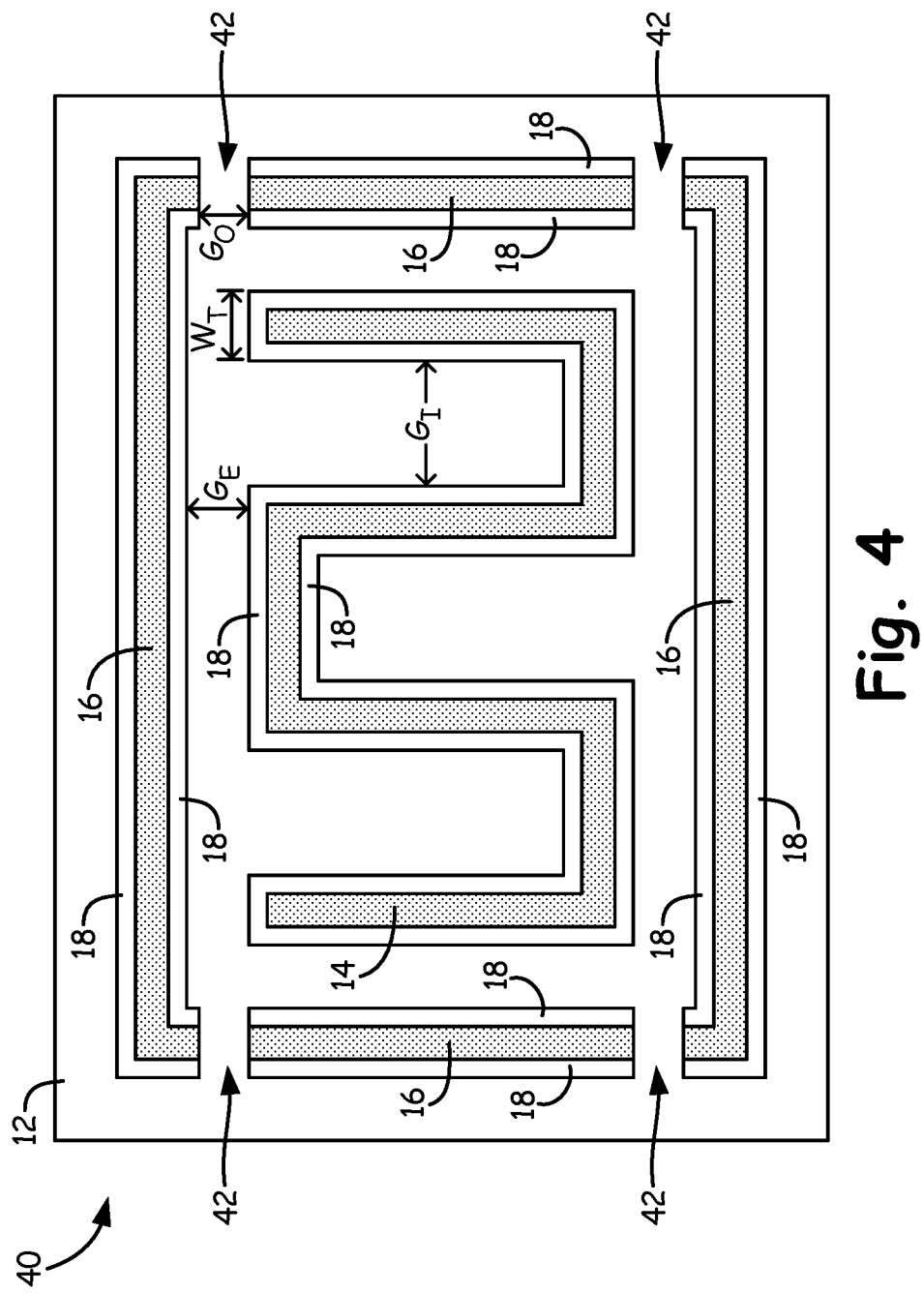

FIG. 4 is a top plan view of MOSFET device 40 formed as a trench semiconductor device according to another embodiment of the present invention. MOSFET device 40 includes semiconductor layer 12, a plurality of interior trenches 14 formed in semiconductor layer 12, and segmented exterior trench 16 having gaps 42 therein formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a snake pattern partially enclosed by segmented exterior trench 16. In the snake pattern, the legs of interior trenches 14 are separated from one another by interior gap distance $G_I$. Each leg of interior trenches 14 has a trench width $W_T$, and interior trenches 14 are spaced from exterior trench 16 by gap distance $G_E$. Gaps 42 in segmented exterior trench 16 have a gap length $G_O$.

In an exemplary embodiment, gap distance $G_I$ may be about 2 μm, trench width $W_T$ may be about 1.4 μm, gap distance $G_E$ may be about 2 μm, and gap length $G_O$ may be about 2 μm.

Figure 5:
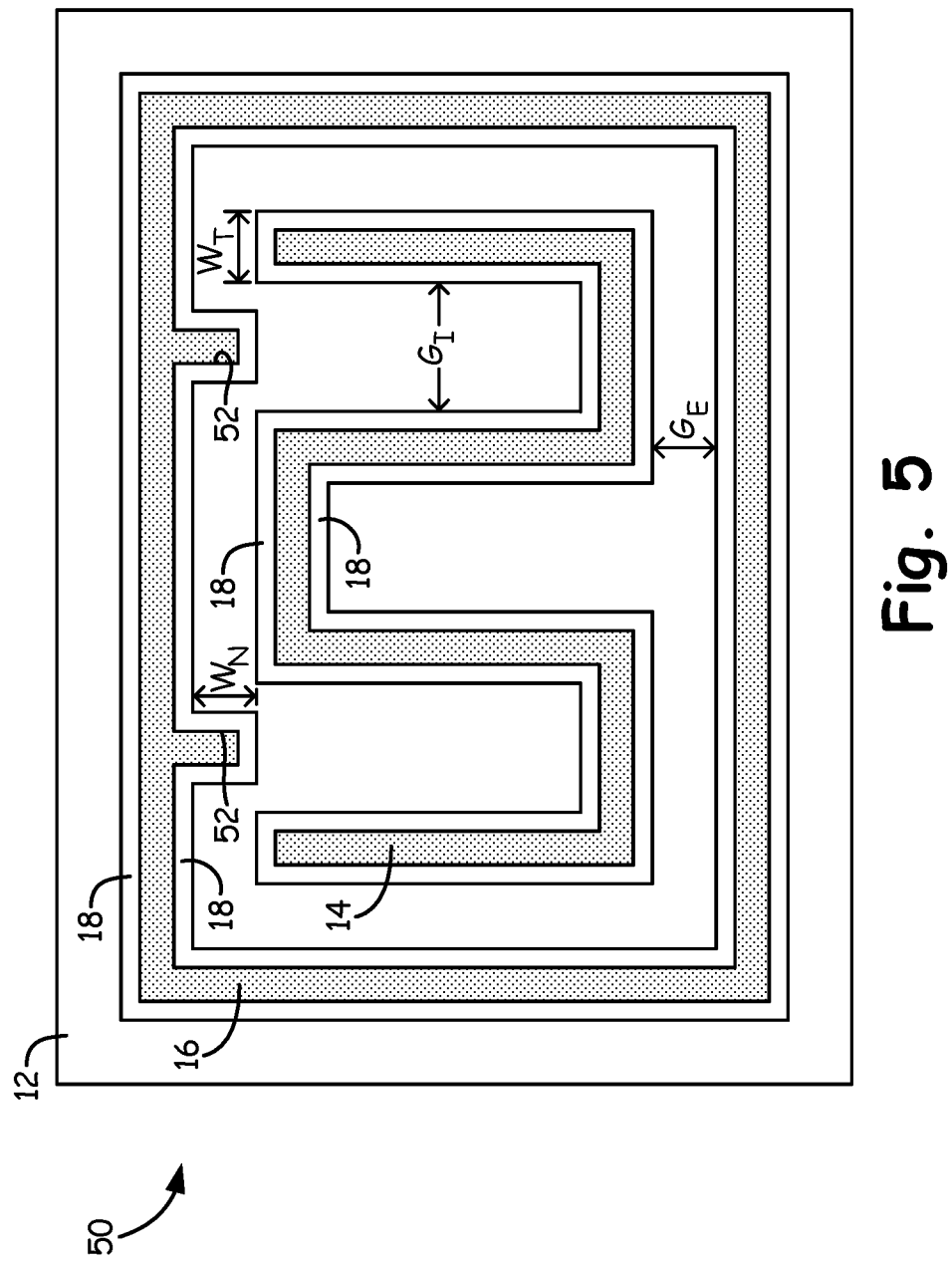

FIG. 5 is a top plan view of MOSFET device 50 formed as a trench semiconductor device according to another embodiment of the present invention. MOSFET device 50 includes semiconductor layer 12, a plurality of interior trenches 14 formed in semiconductor layer 12, and exterior trench 16 having notch features 52 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a snake pattern enclosed by exterior trench 16. In the snake pattern, the legs of interior trenches 14 are separated from one another by interior gap distance $G_I$. Each leg of interior trenches 14 has a trench width $W_T$, and interior trenches 14 are spaced from exterior trench 16 by gap distance $G_E$. Notch features 52 in exterior trench 16 are formed adjacent to openings between the legs of the snake pattern of interior trench 14, and each notch feature has an extending width $W_N$.

In an exemplary embodiment, gap distance $G_I$ may be about 2 μm, trench width $W_T$ may be about 1.4 μm, gap distance $G_E$ may be about 2 μm, and extending width $W_N$ may be about 0.5 μm.

Figure 6:
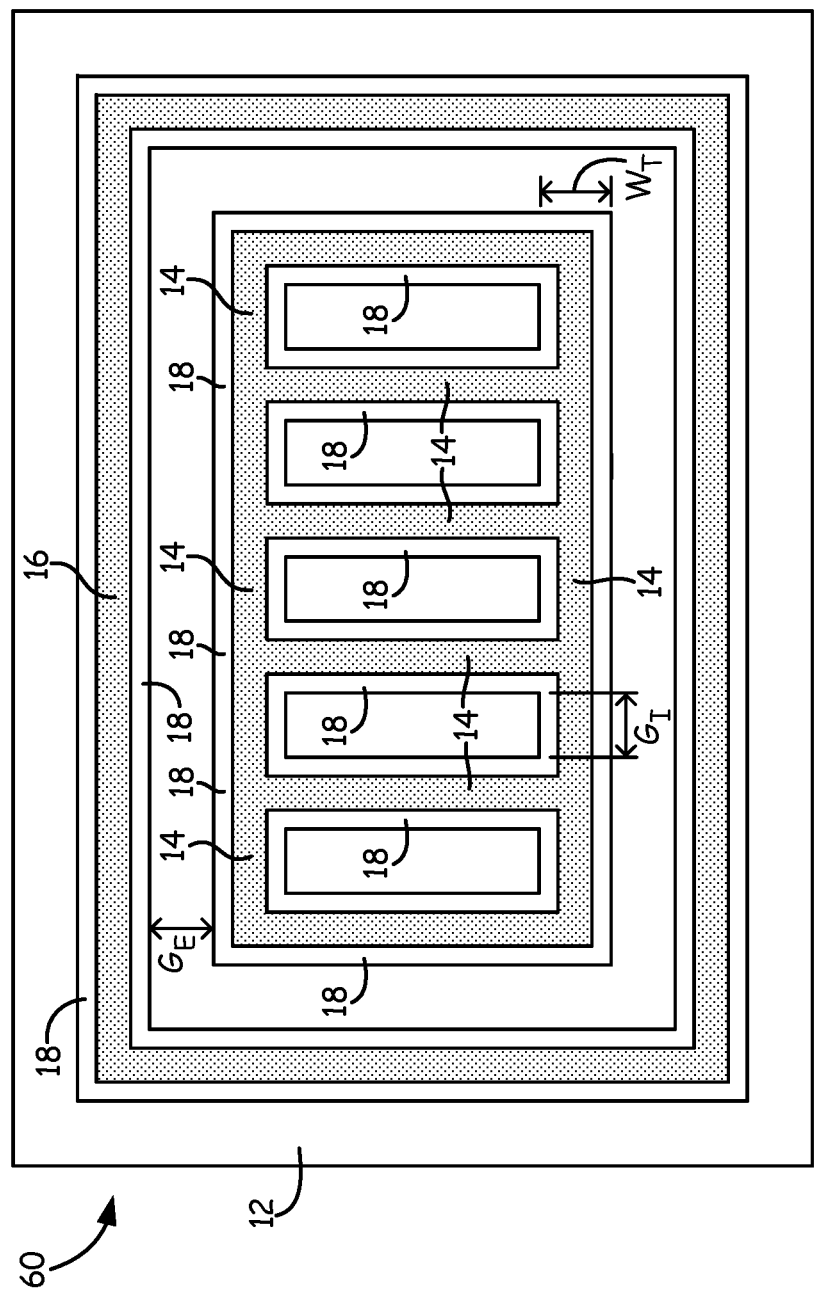

FIG. 6 is a top plan view of MOSFET device 60 formed as a trench semiconductor device according to another embodiment of the present invention. MOSFET device 60 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern having an outer frame and a plurality of vertical trench legs connecting the top and bottom horizontal segments of the outer frame. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$.

In an exemplary embodiment, gap distance $G_I$ may be about 2 μm, trench width $W_T$ may be about 1.4 μm, and gap distance $G_E$ may be about 2 μm.

Figure 7:
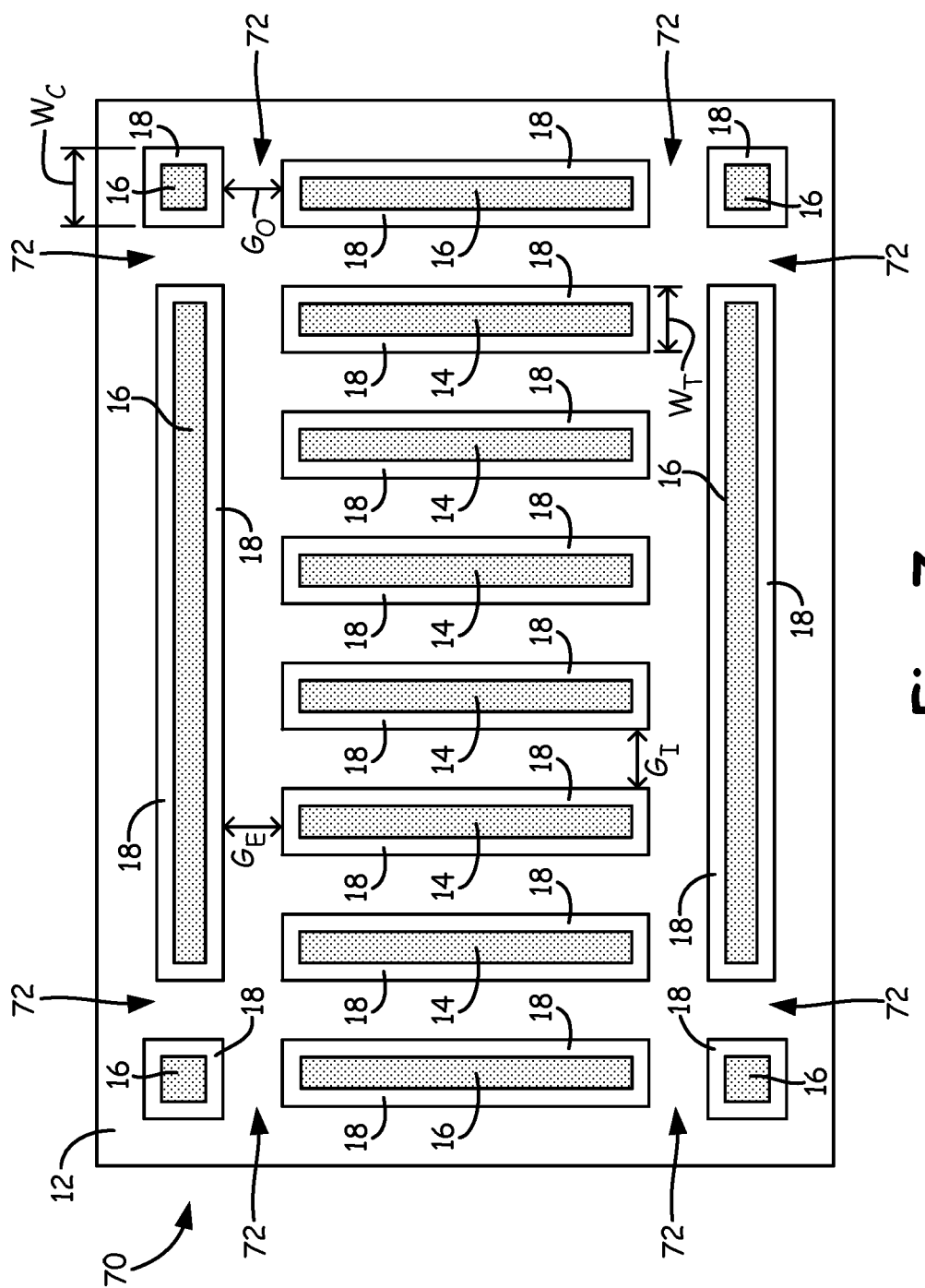

FIG. 7 is a top plan view of MOSFET device 70 formed as a trench semiconductor device according to another embodiment of the present invention. MOSFET device 70 includes semiconductor layer 12, a plurality of interior trenches 14 formed in semiconductor layer 12, and segmented exterior trench 16 having gaps 72 therein formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern of vertical trench legs. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$. Gaps 72 in segmented exterior trench 16 have a gap length $G_O$.

Figure 7A:
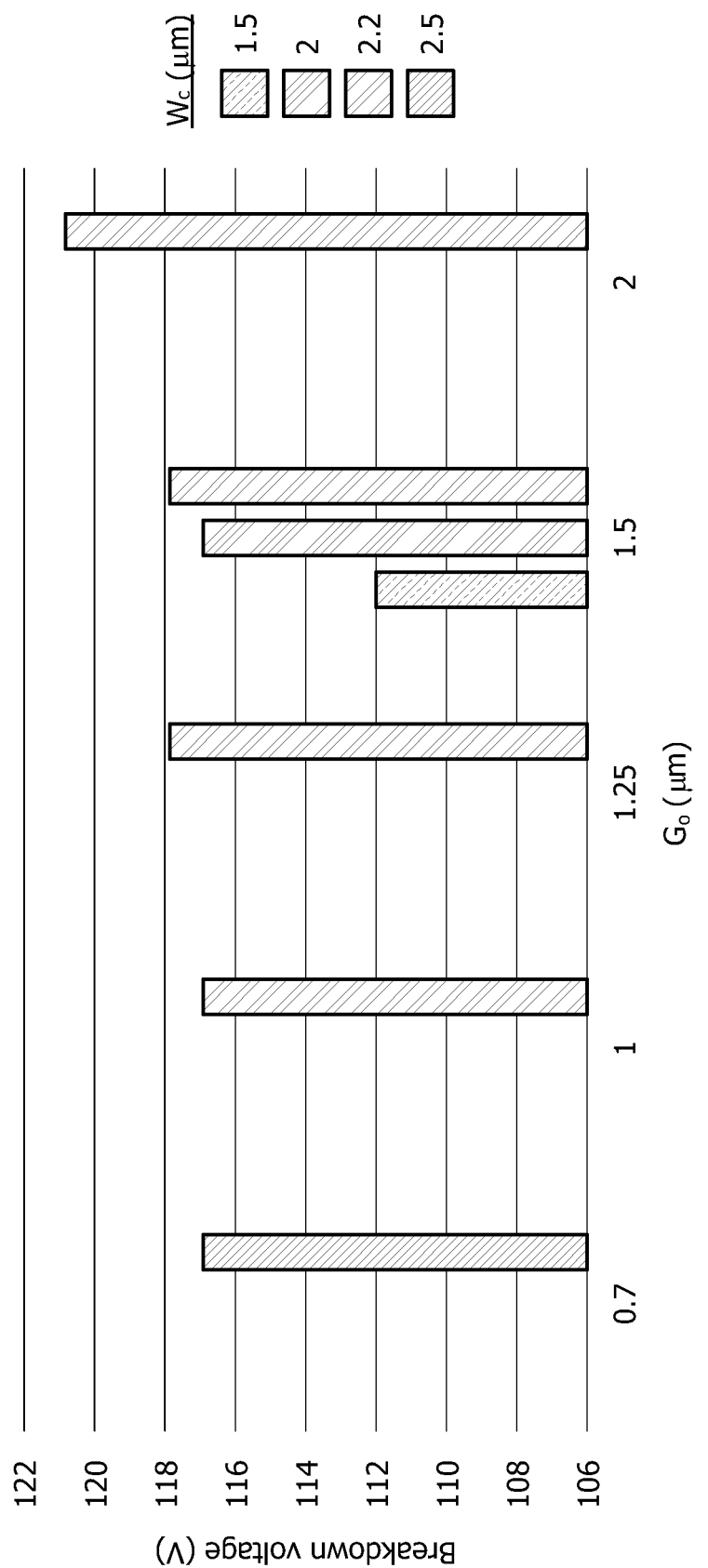
FIG. 7A is a graph illustrating the measured breakdown voltages of a MOSFET device according to the embodiment of FIG. 7 for various dimensions of trench corner width and exterior trench gap length.

In an exemplary embodiment, gap distance $G_I$ may be about 2 μm, trench width $W_T$ may be about 1.4 μm, gap distance $G_E$ may be about 2 μm, gap length $G_O$ may be about 1.7 μm, and trench corner width $W_C$ may be about 1.5 μm. In other embodiments, these dimensions may be adjusted to control the breakdown voltage at the termination of MOSFET device 70. FIG. 7A is a graph illustrating the measured breakdown voltages of MOSFET device 70 for various dimensions of trench corner width $W_C$ and exterior trench gap length $G_O$. As can be seen in FIG. 7A, the dimensions of trench corner width $W_C$ and exterior trench gap length $G_O$ affect the breakdown voltage of the device, and can be controlled in order to provide a desired breakdown voltage value.

Specific examples are shown in FIG. 7A, illustrating that a breakdown voltage of 117 Volts was achieved for an embodiment with exterior trench gap length $G_O$ of 0.7 μm and a trench corner width $W_C$ of 2.5 μm. A similar breakdown voltage of 117 Volts was also achieved for an embodiment with an exterior trench gap length $G_O$ of 1.0 μm and a trench corner width $W_C$ of 2.2 μm. A breakdown voltage of 118 Volts was achieved for an embodiment with an exterior trench gap length $G_O$ of 1.25 μm and a trench corner width $W_C$ of 2.2 μm. At an exterior trench gap length $G_O$ of 1.5 μm, a breakdown voltage of 112 Volts was achieved for an embodiment with a trench corner width $W_C$ of 1.5 μm, a breakdown voltage of 117 Volts was achieved for an embodiment with a trench corner width $W_C$ of 2.0 μm, and a breakdown voltage of 118 Volts was achieved for an embodiment with a trench corner width $W_C$ of 2.2 μm. A breakdown voltage of 121 Volts was achieved for an embodiment with an exterior trench gap length $G_O$ of 2.0 μm and a trench corner width $W_C$ of 2.2 μm.

Figure 8:
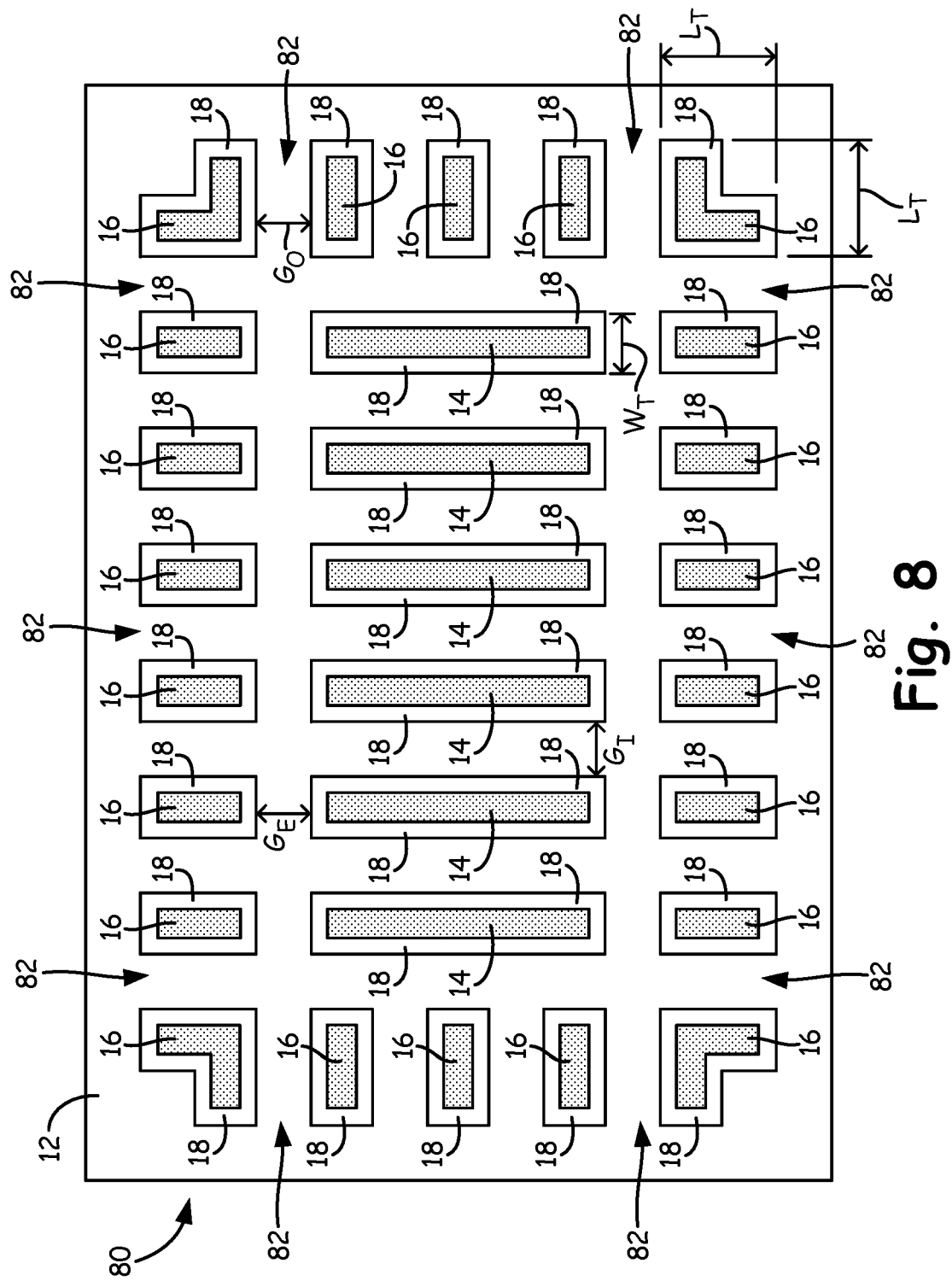

FIG. 8 is a top plan view of MOSFET device 80 formed as a trench semiconductor device according to another embodiment of the present invention. MOSFET device 80 includes semiconductor layer 12, a plurality of interior trenches 14 formed in semiconductor layer 12, and segmented exterior trench 16 having gaps 82 therein formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern of vertical trench legs. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$. Gaps 82 in segmented exterior trench 16 have a gap length $G_O$. Exterior trench 16 is segmented in the embodiment shown in FIG. 8 so that the segments of exterior trench 16 line up with the legs of interior trench 14.

Figure 8A:
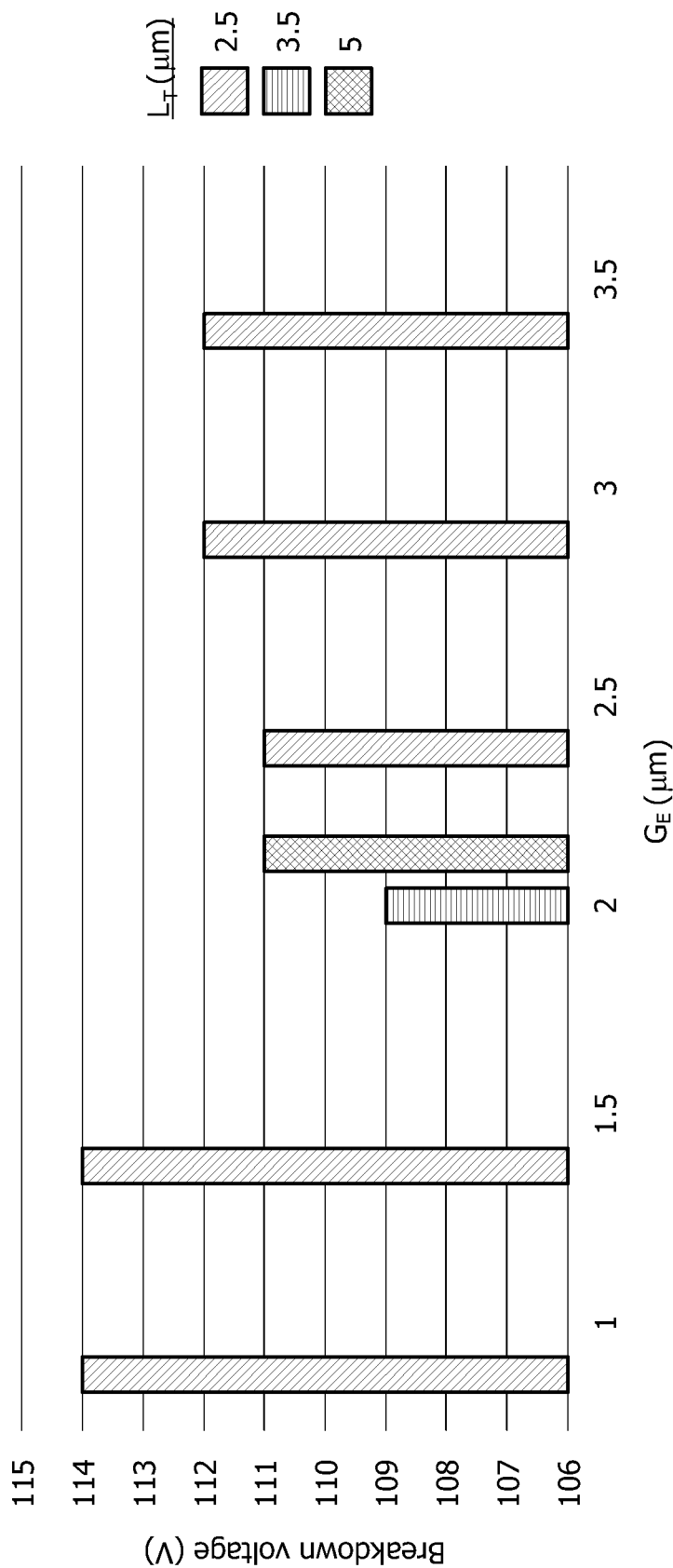
FIG. 8A is a graph illustrating the measured breakdown voltages of a MOSFET device according to the embodiment of FIG. 8 for various dimensions of gap distance and exterior trench length.

In an exemplary embodiment, gap distance $G_I$ may be about 2 μm, trench width $W_T$ may be about 1.4 μm, gap distance $G_E$ may be about 2 μm, and exterior trench length $L_T$ may be about 2 μm. In other embodiments, these dimensions may be adjusted to control the breakdown voltage at the termination of MOSFET device 80. FIG. 8A is a graph illustrating the measured breakdown voltages of MOSFET device 80 for various dimensions of gap distance $G_E$ and exterior trench length $L_T$. As can be seen in FIG. 8A, the dimensions of gap distance $G_E$ and exterior trench length $L_T$ affect the breakdown voltage of the device, and can be controlled in order to provide a desired breakdown voltage value.

Specific examples are shown in FIG. 8A, illustrating that a breakdown voltage of 114 Volts was achieved for an embodiment with a gap distance $G_E$ of 1.0 μm and an exterior trench length $L_T$ of 2.5 μm. A similar breakdown voltage of 114 Volts was also achieved for an embodiment with a gap distance $G_E$ of 1.5 μm and an exterior trench length $L_T$ of 2.5 μm. At a gap distance $G_E$ of 2.0 μm, a breakdown voltage of 109 Volts was achieved for an embodiment with an exterior trench length $L_T$ of 3.5 μm, and a breakdown voltage of 111 Volts was achieved for an embodiment with an exterior trench length $L_T$ of 5.0 μm. A breakdown voltage of 111 Volts was achieved for an embodiment with a gap distance $G_E$ of 2.5 μm and exterior trench length $L_T$ of 2.5 μm. A breakdown voltage of 112 Volts was achieved for an embodiment with a gap distance $G_E$ of 3.0 μm and exterior trench length $L_T$ of 2.5 μm, and also for an embodiment with a gap distance $G_E$ of 3.5 μm and exterior trench length $L_T$ of 2.5 μm.

Figure 9:
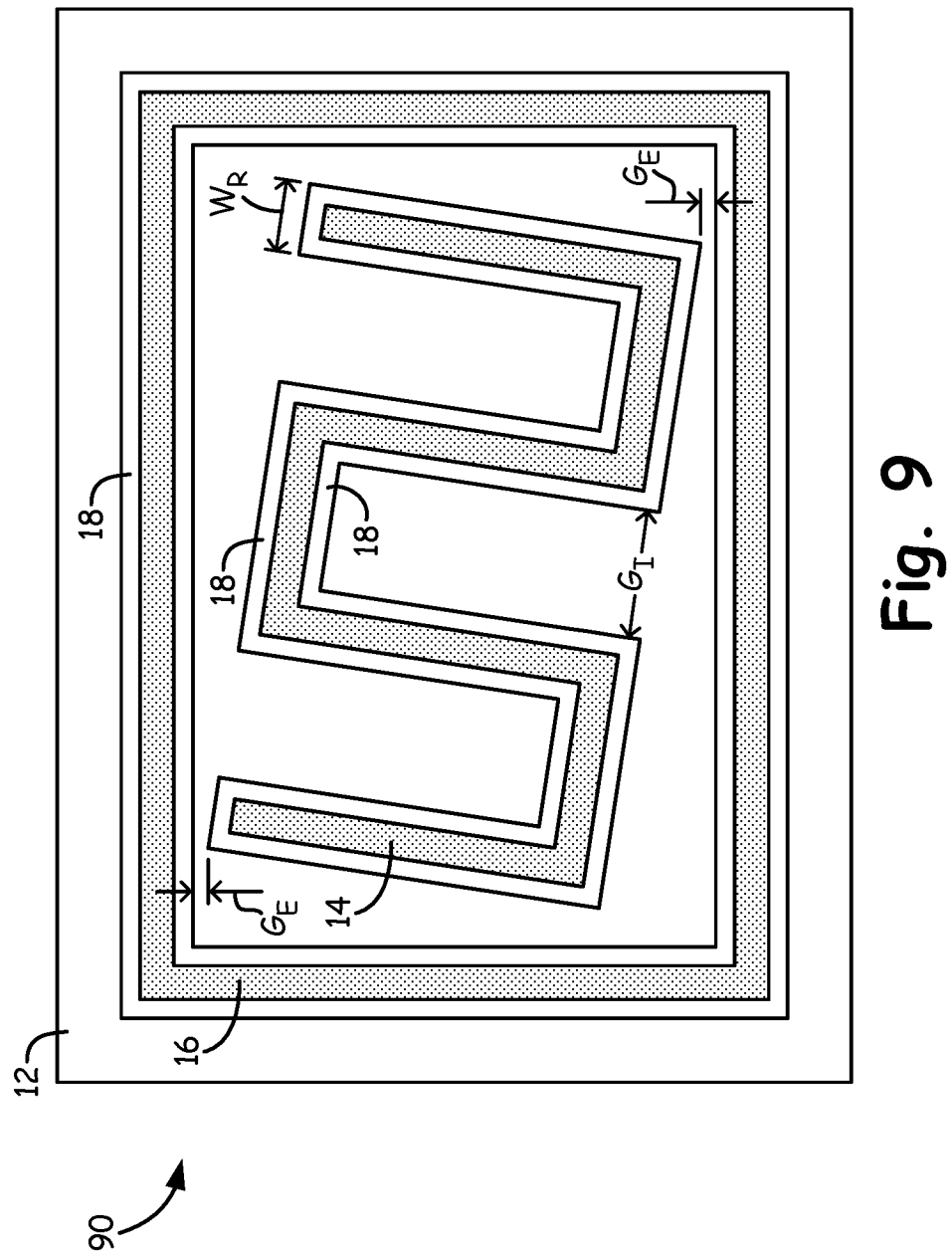

FIG. 9 is a top plan view of MOSFET device 90 formed as a trench semiconductor device according to another embodiment of the present invention. MOSFET device 90 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a snake pattern enclosed by exterior trench 16. The snake pattern is angled diagonally within exterior trench 16 as shown in FIG. 9. In the snake pattern, the legs of interior trenches 14 are separated from one another by interior gap distance $G_I$. Each leg of interior trenches 14 has a trench width $W_T$, and interior trenches 14 are spaced from exterior trench 16 by a minimum gap distance $G_E$.

In an exemplary embodiment, gap distance $G_I$ may be about 2 μm, trench width $W_T$ may be about 1.4 μm, and gap distance $G_E$ may be about 2 μm.

Figure 10:
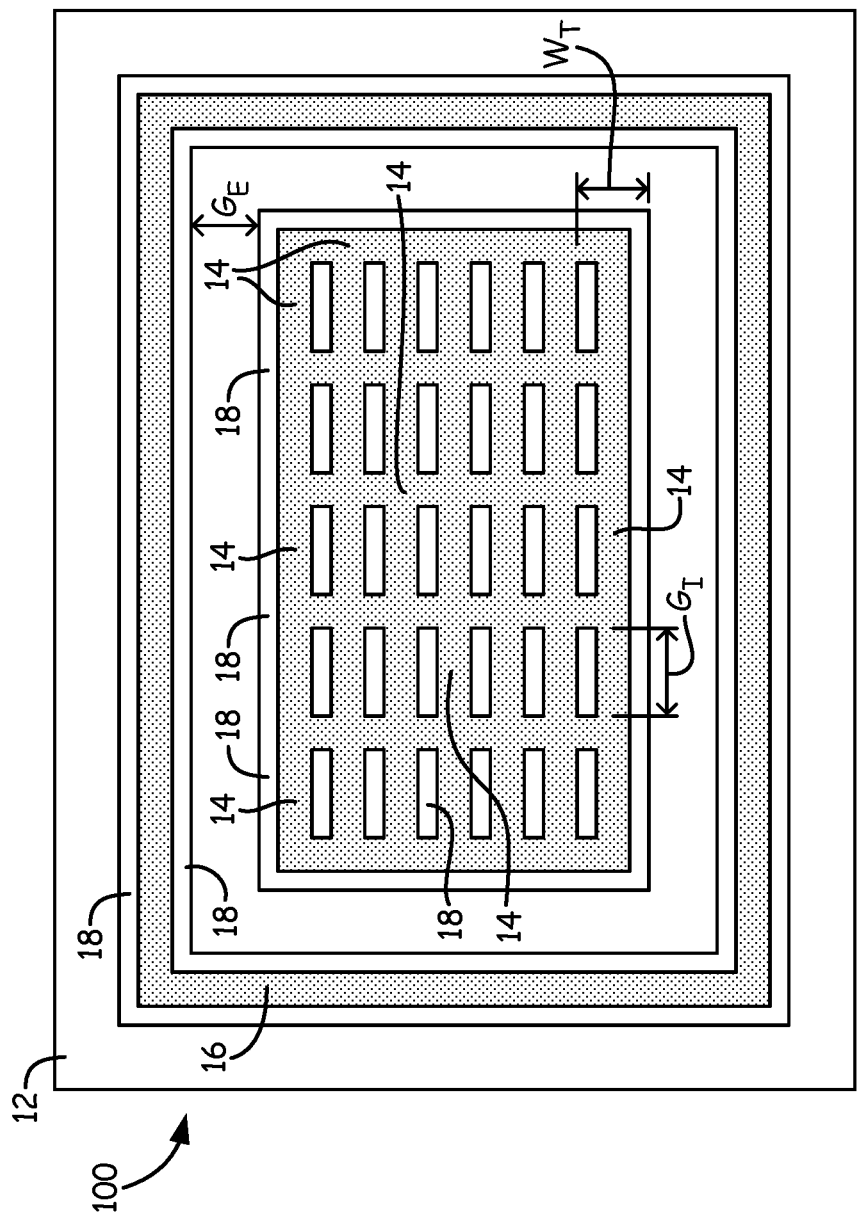

FIG. 10 is a top plan view of MOSFET device 100 formed as a trench semiconductor device according to another embodiment of the present invention. MOSFET device 100 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a grid pattern enclosed by exterior trench 16. In the grid pattern, the legs of interior trenches 14 are separated from one another by interior gap distance $G_I$. Each leg of interior trenches 14 has a trench width $W_T$, and interior trenches 14 are spaced from exterior trench 16 by gap distance $G_E$.

In an exemplary embodiment, gap distance $G_I$ may be about 4.5 μm, trench width $W_T$ may be about 1.4 μm, and gap distance $G_E$ may be about 2 μm.

Figure 11:
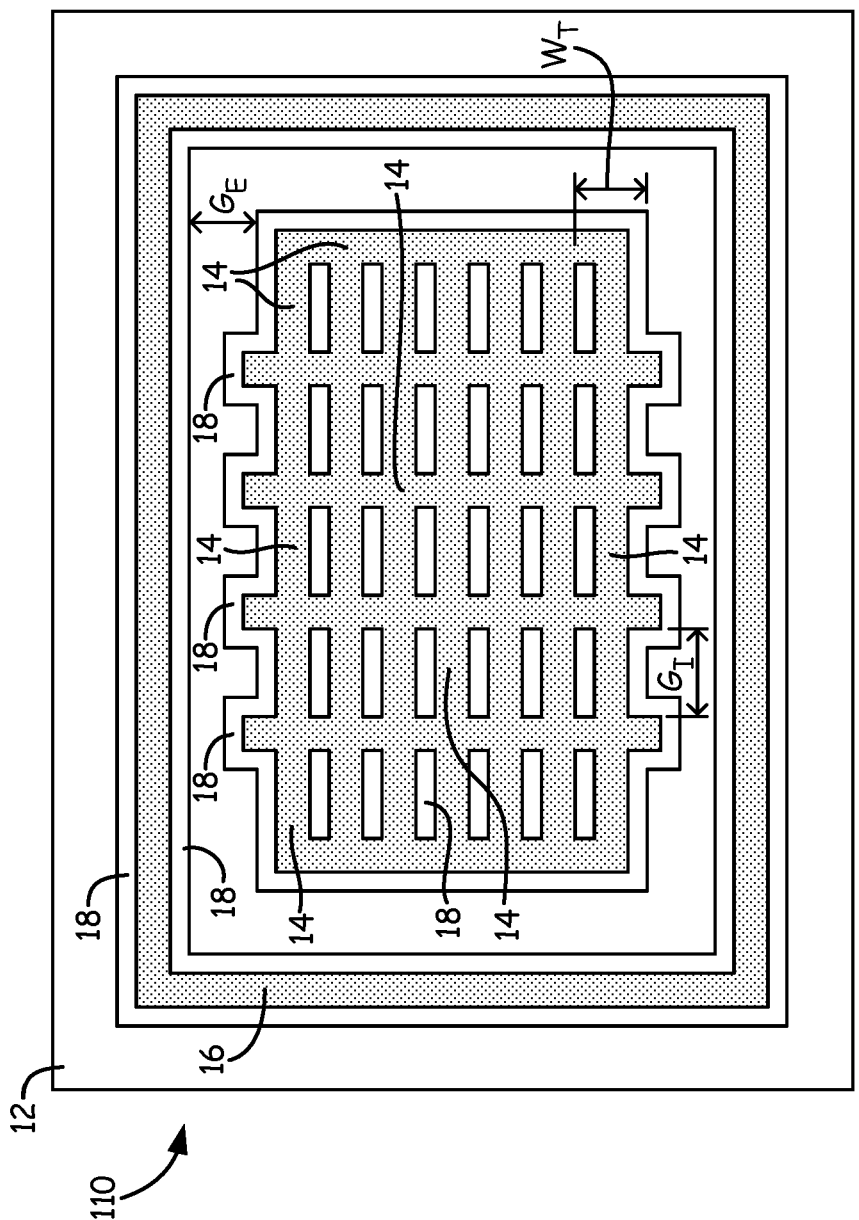

FIG. 11 is a top plan view of MOSFET device 110 formed as a trench semiconductor device according to another embodiment of the present invention. MOSFET device 110 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a grid pattern enclosed by exterior trench 16. In the grid pattern, the legs of interior trenches 14 are separated from one another by interior gap distance $G_I$. The vertical legs of interior trenches 14 extend beyond a square/rectangular grid pattern at vertical trench extensions 112. Each leg of interior trenches 14 has a trench width $W_T$, and interior trenches 14 are spaced from exterior trench 16 by gap distance $G_E$.

In an exemplary embodiment, gap distance $G_I$ may be about 4.5 µm, trench width $W_T$ may be about 1.4 µm, and gap distance $G_E$ may be about 2 µm.

Figure 12:
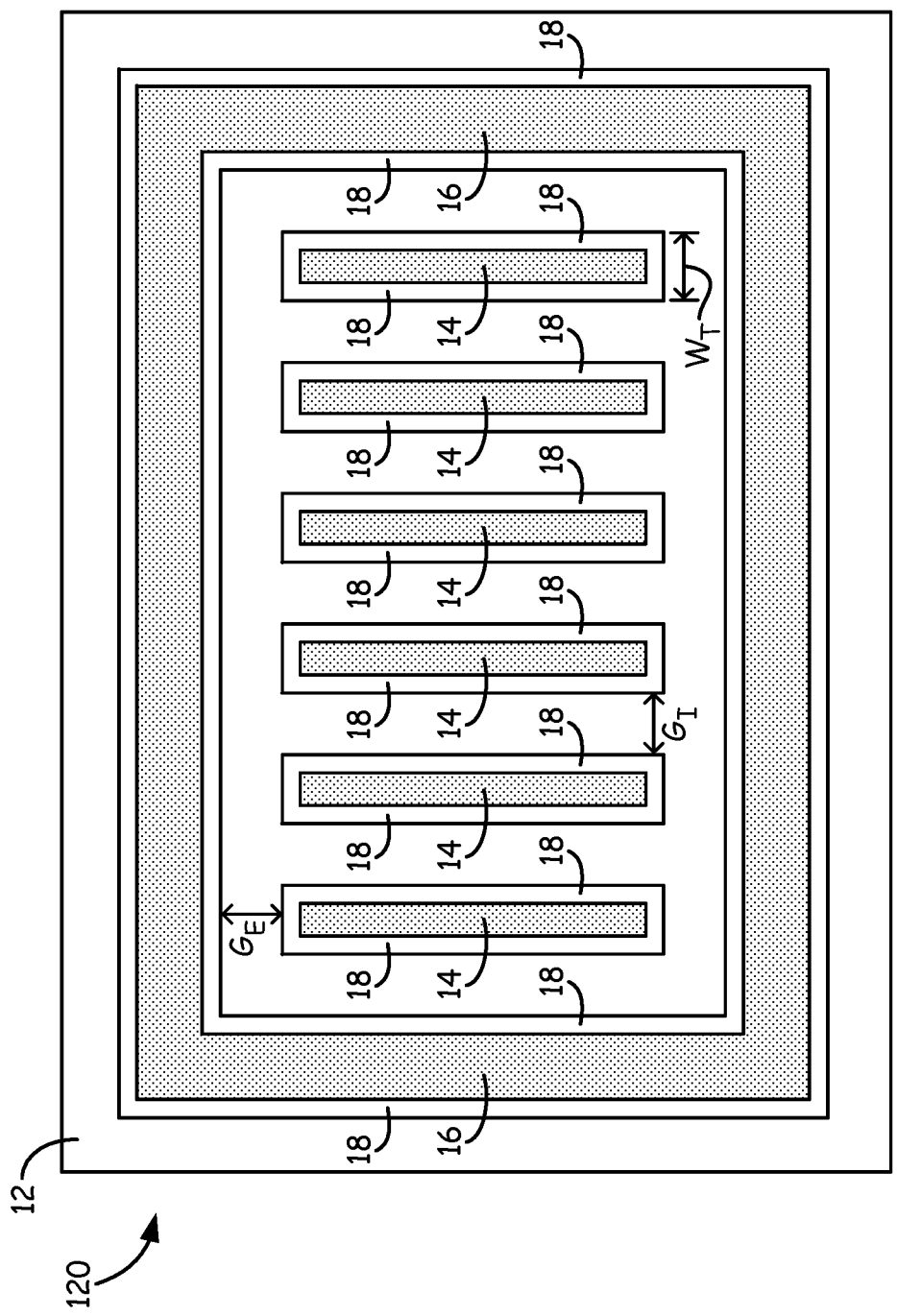

FIG. 12 is a top plan view of MOSFET device 120 formed as a trench semiconductor device according to another embodiment of the present invention. MOSFET device 120 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern of vertical trench legs. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$. Exterior trench 16 has a trench width that is greater than the trench width $W_T$ of interior trenches 14, such as twice the trench width $W_T$ in an exemplary embodiment.

In an exemplary embodiment, gap distance $G_I$ may be about 2.0 µm, trench width $W_T$ may be about 1.4 µm, and gap distance $G_E$ may be about 2 µm.

Figure 13:
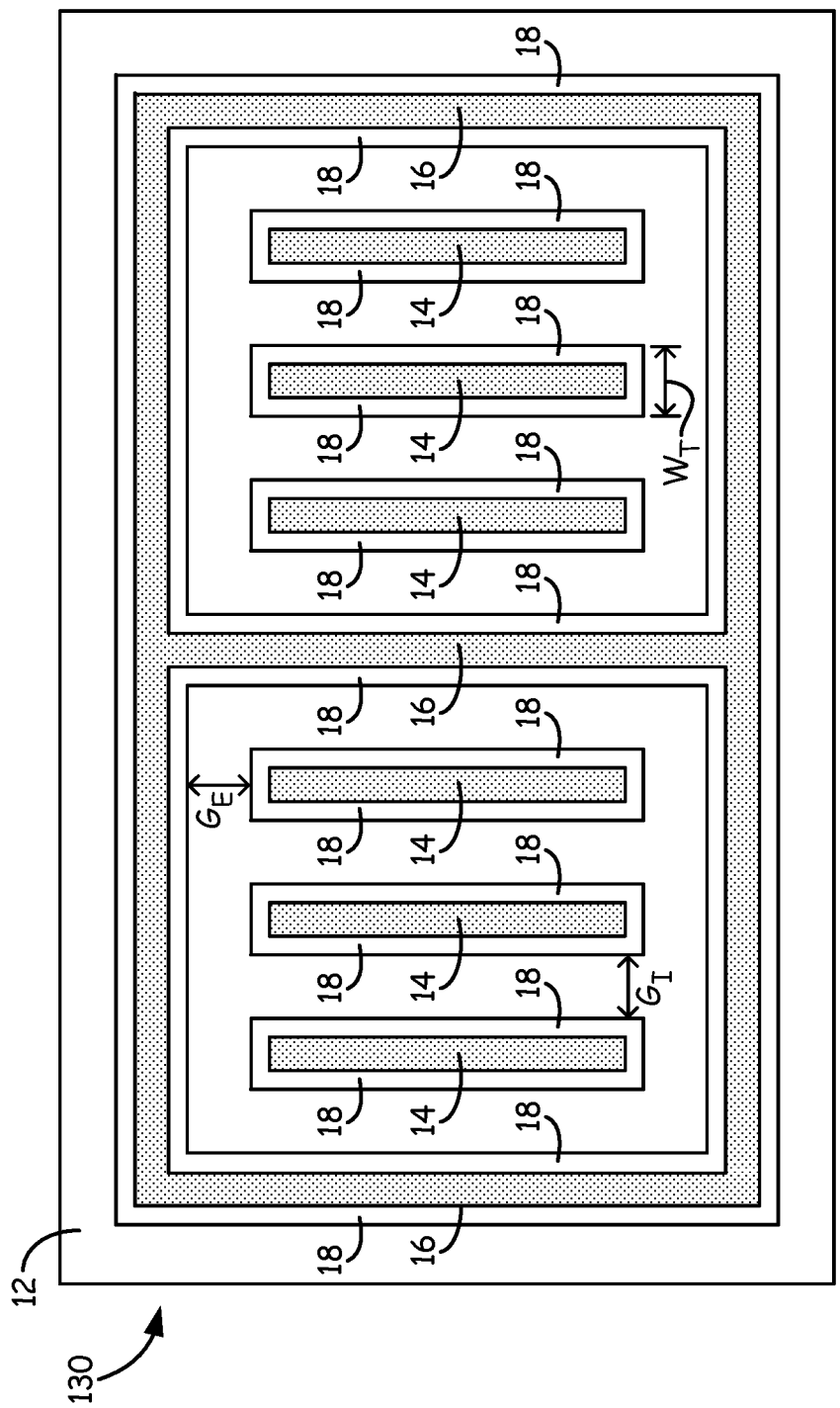

FIG. 13 is a top plan view of MOSFET device 130 formed as a trench semiconductor device according to another embodiment of the present invention. MOSFET device 130 includes semiconductor layer 12, a plurality of interior trenches 14 formed in semiconductor layer 12, and exterior trench 16 formed in semiconductor layer 12. Middle dividing trench 136 is also formed in semiconductor layer 12, dividing the interior region inside exterior trench 16 into two separate regions, each of which includes a plurality of interior trenches 14. Interior trenches 14, exterior trench 16 and middle dividing trench 136 are lined with dielectric material 18, such as silicon dioxide in some embodiments, and the dielectric lined trenches are filled with a conductive material (not shown) such as a metal or doped polysilicon. Interior trenches 14 are formed in a pattern of vertical trench legs. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$.

In an exemplary embodiment, gap distance $G_I$ may be about 2.0 µm, trench width $W_T$ may be about 1.4 µm, and gap distance $G_E$ may be about 2 µm.

Figure 14:
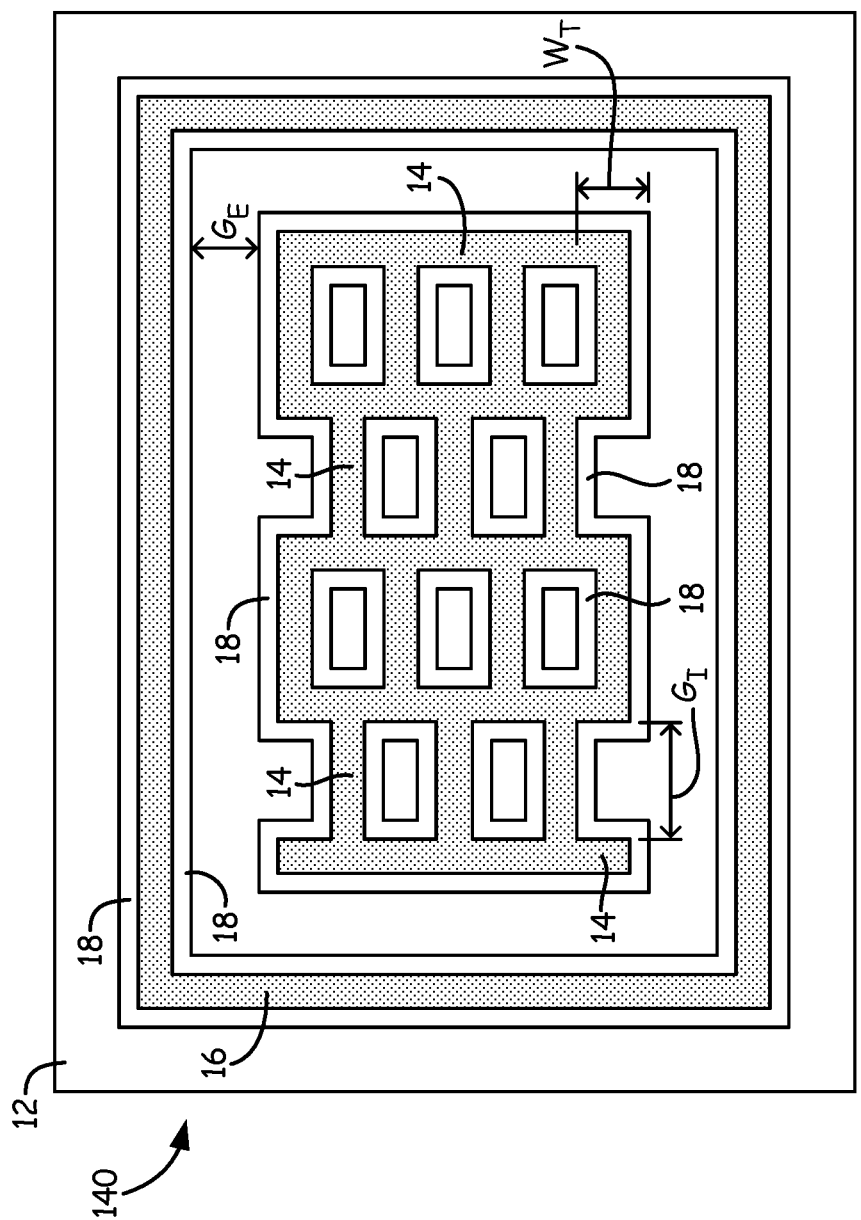

FIG. 14 is a top plan view of MOSFET device 140 formed as a trench semiconductor device according to another embodiment of the present invention. MOSFET device 140 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in an offset grid pattern enclosed by exterior trench 16, as shown in FIG. 14. In the grid pattern, the vertical legs of interior trenches 14 are separated from one another by interior gap distance $G_I$, as are adjacent horizontal legs of interior trenches 14. Each leg of interior trenches 14 has a trench width $W_T$, and interior trenches 14 are spaced from exterior trench 16 by gap distance $G_E$.

In an exemplary embodiment, gap distance $G_I$ may be about 4.5 µm, trench width $W_T$ may be about 1.4 µm, and gap distance $G_E$ may be about 2 µm.

Figure 15:
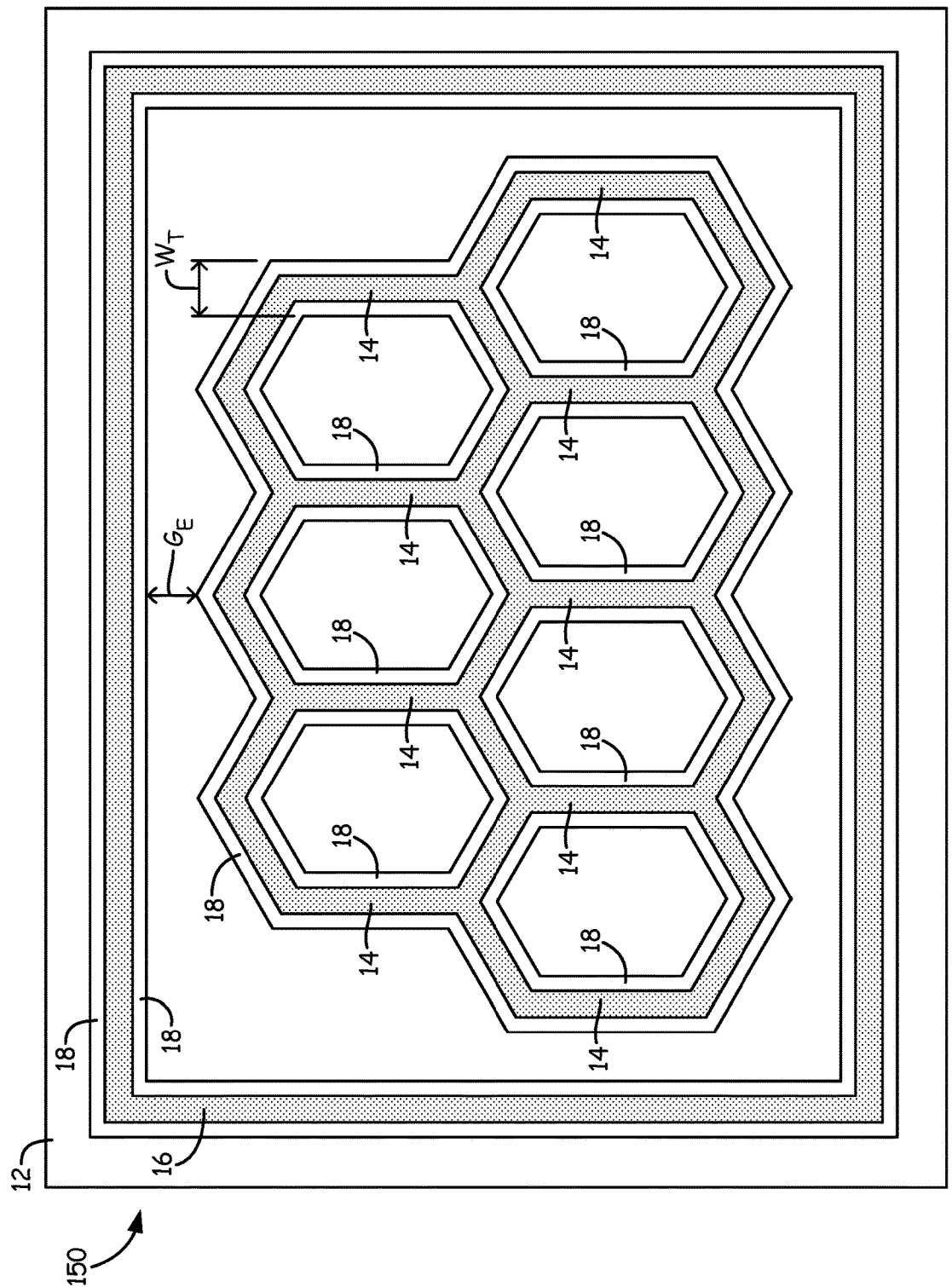

FIG. 15 is a top plan view of MOSFET device 150 formed as a trench semiconductor device according to another embodiment of the present invention. MOSFET device 150 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a honeycomb pattern enclosed by exterior trench 16, as shown in FIG. 15. In the honeycomb pattern, adjacent vertical legs of interior trenches 14 are separated from one another by interior gap distance $G_I$. Each leg of interior trenches 14 has a trench width $W_T$, and interior trenches 14 are spaced from exterior trench 16 by gap distance $G_E$.

In an exemplary embodiment, trench width $W_T$ may be about 1.4 µm, and gap distance $G_E$ may be about 2 µm.

Figure 16:
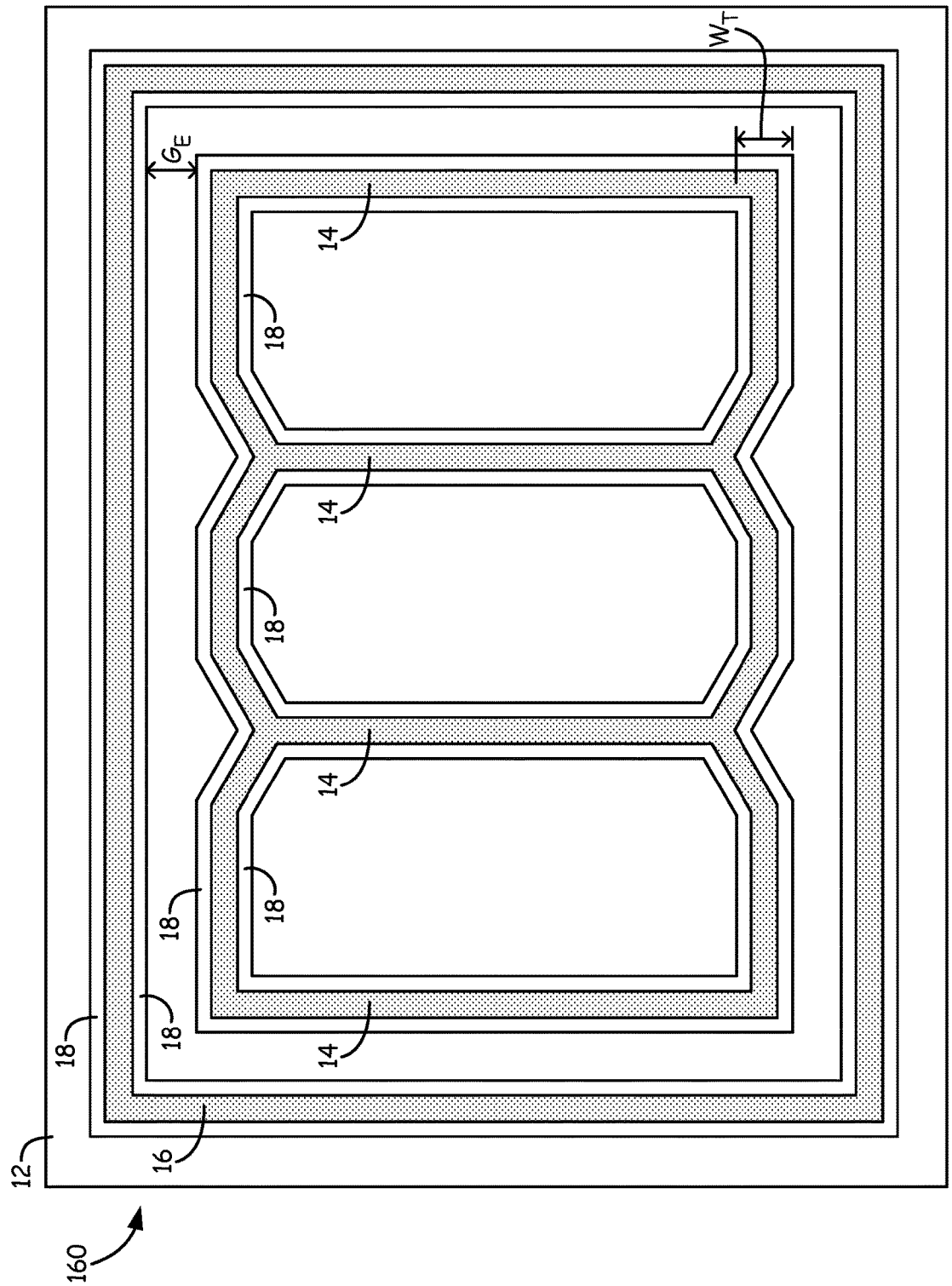

FIG. 16 is a top plan view of MOSFET device 160 formed as a trench semiconductor device according to another embodiment of the present invention. MOSFET device 160 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a geometric trench pattern formed of six sided polygons and eight sided polygons enclosed by exterior trench 16, as shown in FIG. 16. In the geometric trench pattern, adjacent vertical legs of interior trenches 14 are separated from one another by interior gap distance $G_I$. Each leg of interior trenches 14 has a trench width $W_T$, and interior trenches 14 are spaced from exterior trench 16 by gap distance $G_E$.

In an exemplary embodiment, trench width $W_T$ may be about 1.4 µm, and gap distance $G_E$ may be about 2 µm.

The embodiments of the present invention disclosed herein include geometric features that can be mixed and matched with any other disclosed embodiments. For example, the segmented outer trench 16 shown in FIG. 7 may be used with the snake trench pattern shown in FIG. 1A in an alternative embodiment. Other features may also be combined and modified to form additional alternative embodiments and configurations.

In many of the embodiments disclosed herein, modifications of the dimensions of trenches or other features, as well as of gaps between trenches or other features, are able to be modified in order to adjust the performance of the device, such as the breakdown voltage of the device. Examples of such modifications and the resulting performance adjustments are discussed specifically with respect to the embodiments of FIGS. 7 and 8, and modifications to others of the disclosed embodiments will also result in performance adjustments that may be selected and optimized for a particular application.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the description herein.

The invention claimed is:

1. A trench semiconductor device comprising:
a layer of semiconductor material;
an exterior trench pattern formed in the layer of semiconductor material, the exterior trench pattern comprising first and second parallel exterior trench portions that form first and third opposite sides of a first rectangle shape, and third and fourth parallel exterior trench portions connected to and perpendicular to the first and second parallel exterior trench portions that form second and fourth opposite sides of the first rectangle shape, each of the first, second, third and fourth exterior trench portions being lined with dielectric material and filled with conductive material;
a first interior trench pattern formed in the layer of semiconductor material, surrounded by the exterior trench pattern, the first interior trench pattern comprising first and second parallel interior trench portions that form first and third opposite sides of a second rectangle shape, and third and fourth parallel interior trench portions connected to and perpendicular to the first and second parallel interior trench portions that form second and fourth opposite sides of the second rectangle shape, each of the first, second, third and fourth interior trench portions being lined with dielectric material and filled with conductive material;
a second interior trench pattern formed in the layer of semiconductor material, surrounded by the exterior trench pattern, wherein the second interior trench pattern comprising fifth and sixth parallel interior trench portions that form first and third opposite sides of a third rectangle shape, and seventh and eighth parallel interior trench portions connected to and perpendicular to the fifth and sixth parallel interior trench portions that form second and fourth opposite sides of the third rectangle shape, each of the fifth, sixth, seventh and eighth interior trench portions being lined with dielectric material and filled with conductive material; and
a third interior trench pattern formed in the layer of semiconductor material, surrounded by the exterior trench pattern, wherein the third interior trench pattern comprising ninth and tenth parallel interior trench portions that form first and third opposite sides of a fourth rectangle shape, and eleventh and twelfth parallel interior trench portions connected to and perpendicular to the ninth and tenth parallel interior trench portions that form second and fourth opposite sides of the fourth rectangle shape, each of the ninth, tenth, eleventh and twelfth interior trench portions being lined with dielectric material and filled with conductive material,
wherein the first interior trench pattern, the second interior trench pattern and the third interior trench pattern are parallel to each other, and
wherein the second interior trench pattern is between the first interior trench pattern and the third interior trench pattern.

2. The trench semiconductor device of claim 1, wherein the first exterior trench portion is parallel to the first interior trench portion.

3. The trench semiconductor device of claim 1, wherein the first exterior trench portion is parallel to the fifth interior trench portion.

4. The trench semiconductor device of claim 1, wherein the first and second interior trench patterns are separated from each other by an interior gap distance of about 2.0 μm.

5. The trench semiconductor device of claim 1, wherein the fifth, the sixth, the seventh and the eighth interior trench portions each have a trench width of about 1.4 μm.

6. The trench semiconductor device of claim 5, wherein the first, the second, the third and the fourth interior trench portions each have a trench width of about 1.4 μm.

7. The trench semiconductor device of claim 1, wherein the first interior trench portion and the fifth interior trench portion are spaced from the first exterior trench portion by a gap distance of about 2.0 μm.

8. The trench semiconductor device of claim 1, wherein the first exterior trench portion is parallel to the ninth interior trench portion.

9. The trench semiconductor device of claim 1, wherein the first, second and third interior trench patterns are separated from each other by an interior gap distance of about 2.0 μm.

10. The trench semiconductor device of claim 1, wherein the ninth, the tenth, the eleventh and the twelfth interior trench portions each have a trench width of about 1.4 μm.

11. The trench semiconductor device of claim 10, wherein the fifth, the sixth, the seventh and the eighth interior trench portions each have a trench width of about 1.4 μm.

12. The trench semiconductor device of claim 11, wherein the first, the second, the third and the fourth interior trench portions each have a trench width of about 1.4 μm.

13. The trench semiconductor device of claim 1, wherein the first, the second, the third and the fourth interior trench portions each have a trench width of about 1.4 μm.

14. The trench semiconductor device of claim 1, wherein the first interior trench portion is spaced from the first exterior trench portion by a gap distance of about 2.0 μm.

15. The trench semiconductor device of claim 1, wherein the first and second parallel exterior trench portions that form the first and third opposite sides of the first rectangle shape form long sides of the first rectangle shape, and
wherein the third and fourth parallel exterior trench portions that form the second and fourth opposite sides of the first rectangle shape form short sides of the first rectangle shape.

16. The trench semiconductor device of claim 15, wherein the first and second parallel interior trench portions that form the first and third opposite sides of the second rectangle shape form short sides of the second rectangle shape, and
wherein the third and fourth parallel interior trench portions that form the second and fourth opposite sides of the second rectangle shape form short sides of the second rectangle shape.

17. The trench semiconductor device of claim 1, wherein the first, fifth and ninth interior trench portions are each separated from the first exterior trench portion by an equal distance.

18. The trench semiconductor device of claim 17, wherein the second, sixth and tenth interior trench portions are each separated from the second exterior trench portion by an equal distance.

19. The trench semiconductor device of claim 1, wherein the first exterior trench portion is parallel to the first interior trench portion,
   wherein the first exterior trench portion is parallel to the fifth interior trench portion, and
   wherein the first exterior trench portion is parallel to the ninth interior trench portion.

20. The trench semiconductor device of claim 1, wherein the first interior trench portion, the fifth interior trench portion, and the ninth interior trench portion are each separated from the first exterior trench portion by a first distance,
   wherein the second interior trench portion, the sixth interior trench portion, and the tenth interior trench portion are each separated from the second exterior trench portion by a second distance, and
   wherein the first distance and the second distance are equal.

* * * * *

UNITED STATES PATENT AND TRADEMARK OFFICE
CERTIFICATE OF CORRECTION

PATENT NO. : 11,245,006 B2
APPLICATION NO. : 16/724862
DATED : February 8, 2022
INVENTOR(S) : Dosi Dosev et al.

It is certified that error appears in the above-identified patent and that said Letters Patent is hereby corrected as shown below:

In the Specification

Column 6, Line 37, delete "width $W_T$," and replace with --width $W_R$,--.

Column 6, Line 41, delete "width $W_T$" and replace with --width $W_R$--.

Signed and Sealed this
Nineteenth Day of September, 2023

Katherine Kelly Vidal
*Director of the United States Patent and Trademark Office*